United States Patent
Chang et al.

(10) Patent No.: US 10,472,731 B2
(45) Date of Patent: Nov. 12, 2019

(54) SEMICONDUCTOR STRUCTURE AND METHOD OF FORMING THE SAME

(71) Applicants: UNITED MICROELECTRONICS CORP., Hsin-chu (TW); Fujian Jinhua Integrated Circuit Co., Ltd., Quanzhou, Fujian province (CN)

(72) Inventors: Feng-Yi Chang, Tainan (TW); Fu-Che Lee, Taichung (TW); Ming-Feng Kuo, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 25 days.

(21) Appl. No.: 15/497,182

(22) Filed: Apr. 25, 2017

(65) Prior Publication Data

US 2018/0277354 A1 Sep. 27, 2018

(30) Foreign Application Priority Data

Mar. 24, 2017 (CN) .......................... 2017 1 0180554

(51) Int. Cl.
| | | |
|---|---|---|
| *H01L 21/31* | (2006.01) | |
| *C25F 3/12* | (2006.01) | |
| *H01L 21/311* | (2006.01) | |
| *H01L 23/525* | (2006.01) | |
| *H01L 23/00* | (2006.01) | |

(52) U.S. Cl.
CPC .......... *C25F 3/12* (2013.01); *H01L 21/31116* (2013.01); *H01L 23/5258* (2013.01); *H01L 24/00* (2013.01)

(58) Field of Classification Search
CPC ............................ C25F 3/12; H01L 21/31116
See application file for complete search history.

(56) References Cited

U.S. PATENT DOCUMENTS

| | | | |
|---|---|---|---|
| 6,518,643 B2 | 2/2003 | McDevitt | |
| 6,835,999 B2 | 12/2004 | Omura | |
| 2005/0156276 A1* | 7/2005 | Sakoh | ................. H01L 23/3192 257/529 |

FOREIGN PATENT DOCUMENTS

JP 2001176976 6/2001

* cited by examiner

*Primary Examiner* — Trang Q Tran
(74) *Attorney, Agent, or Firm* — Winston Hsu

(57) ABSTRACT

A method of forming a semiconductor structure is disclosed. A substrate is provided with a pad metal and a fuse metal formed thereon. A liner and an etching stop layer are formed at least covering a top surface of the fuse metal. A dielectric layer is formed on the substrate and a passivation layer is formed over the dielectric layer. A pad opening and a fuse opening are defined in the passivation layer. A first etching step is performed to remove the dielectric layer from the pad opening and the fuse opening to expose a top surface of the pad metal from the pad opening and an upper surface of the etching stop layer from the fuse opening respectively. A second etching step is performed to remove the etching stop layer from the fuse opening until an upper surface of the liner is exposed.

6 Claims, 12 Drawing Sheets

(a)

(b)

SEMICONDUCTOR STRUCTURE AND METHOD OF FORMING THE SAME

BACKGROUND OF THE INVENTION

1. Field of the Invention

The present invention generally relates to a semiconductor device and method of forming the same, and more particularly, to a semiconductor structure including a pad opening and a fuse opening and the method of forming the same.

2. Description of the Prior Art

With the miniaturization and higher degree of integration of semiconductor devices, semiconductor devices are more vulnerable to defects or impurities arising during manufacturing process. For example, a single deficient spot in the circuitry of a semiconductor chip such as metal discontinuity, via opening or electrical characteristic shifting, may cause the whole chip fail to function.

To eliminate the problem aforesaid, it has been employed extensively in the field to incorporate fuses connecting to redundancy circuitries into the circuitry of a semiconductor chip. When a failure of the chip is defected and recognized, particular fuses may be deleted or opened to re-route circuitry along an alternate pathway, thereby repairing the chip.

Fuse structures are usually made of semiconductor materials such as poly silicon, or metals. Among them, metal fuses are more widely used for their better yield. A metal fuse may be formed integrated with a particular metal layer of the metal interconnection system, for example, one of intermediate metal layers or the last metal layer. After uppermost passivation layers are formed, pad openings are then formed to expose the pad metals for further electrical connection. Meanwhile, fuse openings are also formed to provide accesses to fuse metals.

The bottom of the fuse opening usually includes a dielectric layer covering the top surface of a fuse metals, preventing the fuse metal from being directly exposed, thereby eliminating the risk of corrosion and oxidation. However, the thickness and uniformity of the dielectric layer may interfere with the fusing process. Furthermore, during the process of forming pad openings and fuse openings, photoresist and developing solutions used in photolithography processes may be in direct contact with pad metals or fuse metals, causing residues or metal corrosion.

Accordingly, there is still a need in the field to provide optimized structures and a method of forming pad openings and fuse openings which is able to avoid the aforesaid problems.

SUMMARY OF THE INVENTION

The objective of the present invention is to provide a semiconductor structure and method of forming the same, wherein pad openings and fuse openings are formed concurrently through a simplified process and the yield may be improved.

According to one aspect of the present invention, a method of forming a semiconductor structure is provided. First, a substrate is provided. At least a pad metal and at least a fuse metal are formed on the substrate. A liner and an etching stop layer are successively formed on the substrate at least covering a top surface of the fuse metal. After that, a dielectric layer is formed completely covering the pad metal and the fuse metal. A passivation layer is formed on the dielectric layer and then patterned to define a pad opening vertically aligned above the pad metal and a fuse opening vertically aligned above the fuse metal. The dielectric layer is exposed from the pad opening and the fuse opening respectively. An etching step having etching selectivity between the dielectric layer and the etching stop layer is then performed to remove the exposed dielectric layer from the pad opening and the fuse opening downwardly until a top surface of the pad metal and an upper surface of the etching stop layer are exposed from the pad opening and the fuse opening respectively. After that, another etching step is performed to remove the exposed etching stop layer from the fuse opening until an upper surface of the liner is exposed.

According to another aspect of the present invention, a semiconductor structure is provided. The semiconductor structure includes a substrate, at least a pad metal and at least a fuse metal formed on the substrate and completely covered by a dielectric layer. A liner and an etching stop layer are formed between the substrate and the dielectric layer and at least cover a top surface of the fuse metal. A passivation layer is formed on the dielectric layer. A fuse opening is disposed vertically aligned above the fuse metal, penetrating through the passivation layer, the dielectric layer and the etching stop layer without penetrating the liner, therefore exposing an upper surface of the liner directly above the fuse metal. A pad opening is disposed vertically aligned above the pad metal, penetrating through the passivation layer and the dielectric layer, exposing a top surface of the pad metal.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

In the following detailed description, reference is made to the accompanying drawings which form a part hereof, and in which is shown, by way of illustration of specific embodiments in which the invention may be practiced. These embodiments are described in sufficient detail to enable those skilled in the art to practice the invention. Other embodiments may be utilized and that structural, logical and electrical changes may be made without departing from the spirit and scope of the present invention.

FIG. 1 to FIG. 6 are cross-sectional diagrams illustrating the steps of forming the semiconductor structure according to a first embodiment of the present invention.

Figure 1:
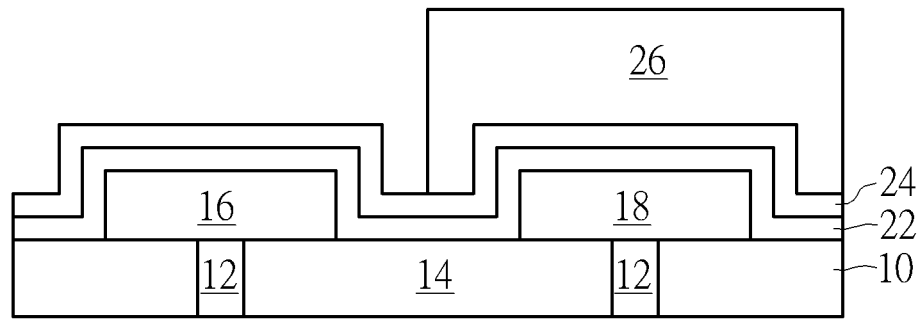
FIG. 1 to FIG. 6 are cross-sectional diagrams illustrating the process steps of forming a semiconductor structure according to a first embodiment of the present invention.
Figure 2:
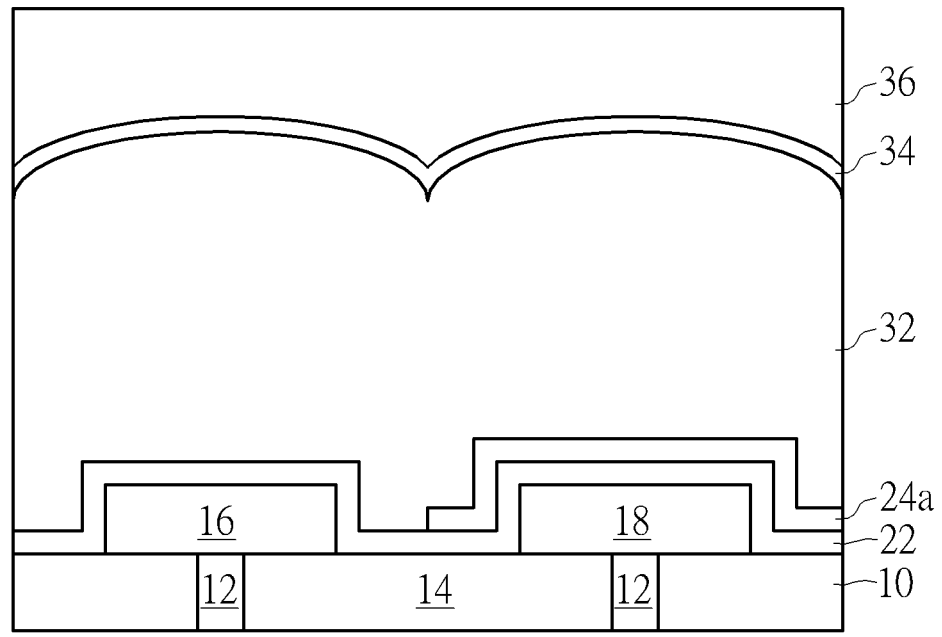

Please refer to FIG. 1 and FIG. 2. First, a substrate 10 is provided. A pad metal 16 and a fuse metal 18 are formed on the substrate 10. The substrate 10 may be a semi-processed semiconductor substrate, for example, having completed the FEOL (Front end of line) process and comprising transistors formed therein or thereon, and a part of the BEOL (back end of line) process of forming internal metal wirings. For the sake of simplicity, only an interlayer dielectric layer 14 and vias 12 electrically coupling with the pad metal 16 and the fuse metal 18 are shown in the diagrams. The interlayer dielectric layer 14 may be made of single layer or multiple layers comprising silicon oxide, un-doped silicon glass (USG), fluoride-doped silicon glass (FSG), or other dielectric materials, but not limited thereto. The via 12 may be made of aluminum, copper, tungsten or other metals, but not limited thereto. According to the illustrated embodiment, the pad metal 16 and the fuse metal 18 are formed in the same horizontal level over the substrate 10. More particularly, the pad metal 16 and the fuse metal 18 may be formed in the same material layer, such as an aluminum layer, a copper layer or a tungsten layer, but not limited thereto. According to various embodiments, the pad metal 16 and the fuse metal 18 may be formed in the uppermost metal layer of the semiconductor structure. The method of forming the pad metal 16 and the fuse metal 18 may include blanketly depositing a metal layer, such as an aluminum layer, on the substrate 10. The metal layer is then patterned into the pad metal 16 and the fuse metal 18. According to various embodiments, the via 12 may be formed structurally integrated with the pad metal 16 or fuse metal 18 by filling opening of each via 12 with the metal layer while depositing the metal layer. It should be understood that a wiring metal (not shown) may also be formed in the metal layer concurrently with the pad metal 16 and the fuse metal 18, and has the same horizontal level with the pad metal 16 and the fuse metal 18.

Subsequently, a liner 22 and an etching stop material layer 24 are formed successively and conformally on the substrate, top surfaces and sidewalls of the pad metal 16 and the fuse metal 18. The etching stop material layer 24 is preferably made of materials different from that of the dielectric layer 32 formed in the following process (shown in FIG. 2) to be etched selectively, and the liner 22 is preferably made of materials different from that of the etching stop material layer 24. For example, when the dielectric layer 32 is made of silicon oxide, the etching stop material layer 24 may be made of silicon nitride, silicon oxynitride or silicon carbon nitride. The liner 22 may be made of silicon oxide.

As shown in FIG. 1, a patterned photoresist layer 26 is then formed on the substrate 10, completely covering the fuse metal 18 but not covering any portion of the pad metal 16. More particularly, the patterned photoresist layer 26 covers the top surface and sidewall of the fuse metal 18, a portion of the substrate 10 abutting the fuse metal 18, but does not cover the top surface and sidewall of the pad metal 16. Consequently, the etching stop material layer 24 on the top surface and sidewall of the pad metal 16 is exposed. According to various embodiments, the etching stop material layer 24 may be subjected to an oxidation treatment before forming the patterned photoresist layer 26 thereby forming an oxide layer (not shown) on its surface to improve the formation of the patterned photoresist layer 26. After forming the patterned photoresist layer 26, a removal process, such as a wet etching process or a dry etching process, having etching selectivity between the liner 22 and the etching stop material layer 24 is carried out to remove the exposed etching stop material layer 24. The etching stop material layer 24 is therefore patterned into an etching stop layer 24a, covering the top surface and sidewall of the fuse metal 18. The patterned photoresist layer 26 is then removed.

As shown in FIG. 2, a dielectric layer 32 is then formed on the substrate 10, completely covering the pad metal 16 and the fuse metal 18. Another dielectric layer 34 and a passivation layer 36 are formed successively on the dielectric layer 32. The dielectric layer 32 may be made of silicon oxide, un-doped silicon glass (USG), fluoride-doped silicon glass (FSG), or other dielectric materials, but not limited thereto. The dielectric layer 34 may be made of silicon nitride, silicon oxynitride or silicon carbon nitride, but not limited thereto. The passivation layer 36 may be made of organic dielectric material such as epoxy, polyimide or benzocyclobutene (BCB), but not limited thereto. Preferably, the passivation layer 36 is made of photo-sensitive polyimide which may be patterned through photolithography process. According to the illustrated embodiment, the dielectric layer 32 may not be planarized before forming the dielectric layer 34. The dielectric layer 32 and the dielectric layer 34 may have surface topography corresponding to the allocation of the pad metal 16 and the fuse metal 18. However, in various embodiments, the dielectric layer 32 may be subjected to a planarization process before forming the dielectric layer 34, therefore forming planar upper surfaces of the dielectric layer 32 and the dielectric layer 34. The passivation layer 36 is preferably formed with a planar upper surface by self-leveling after being coated on the dielectric layer.

Figure 3:
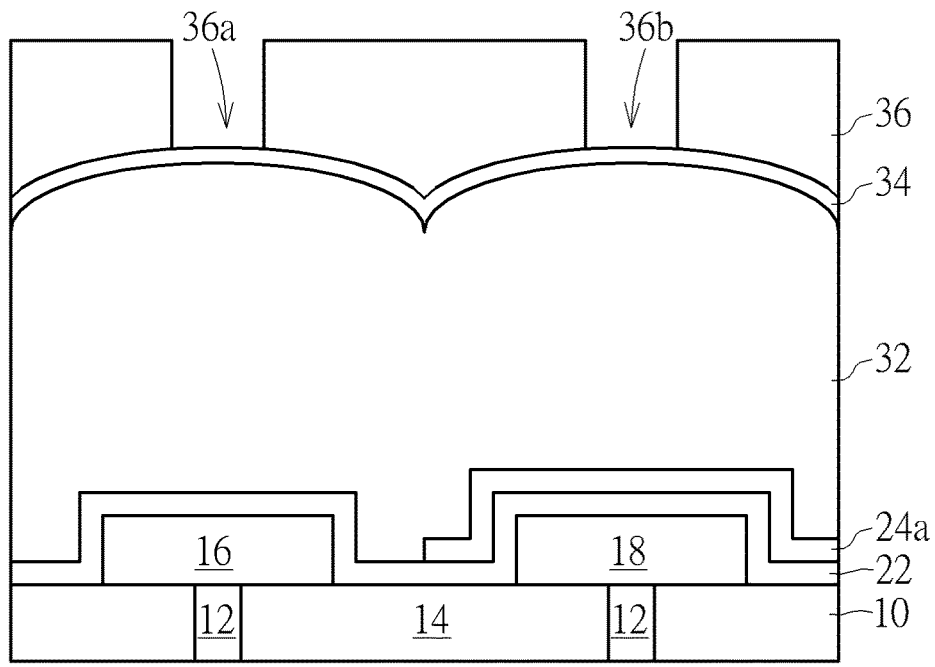

Please refer to FIG. 3. Subsequently, the passivation layer 36 is patterned to define a pad opening 36a and a fuse opening 36b, vertically aligned above the pad metal 16 and the fuse metal 18 respectively and exposing a portion of the dielectric layer 34. Preferably, the width of the pad opening 36a is smaller than that of the pad metal 16, and the width of the fuse opening 36b is smaller than that of the fuse metal 18. In other words, the pad opening 36a and the fuse opening 36b are completely within the area vertically above the pad metal 16 and the fuse metal 18.

Figure 4:
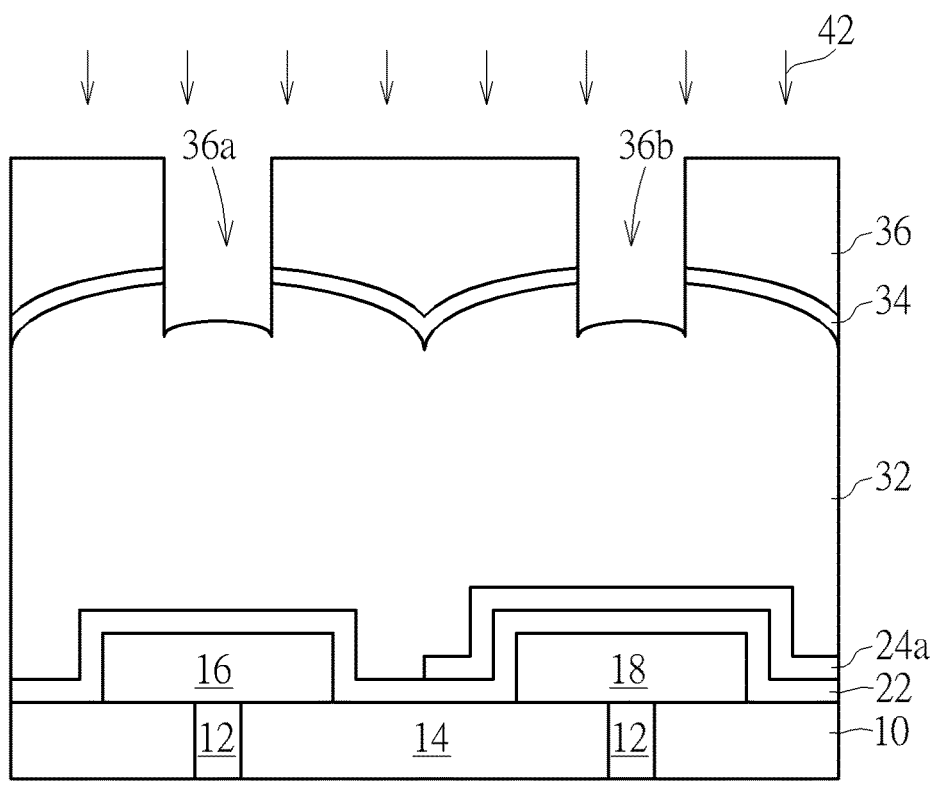
Figure 5:
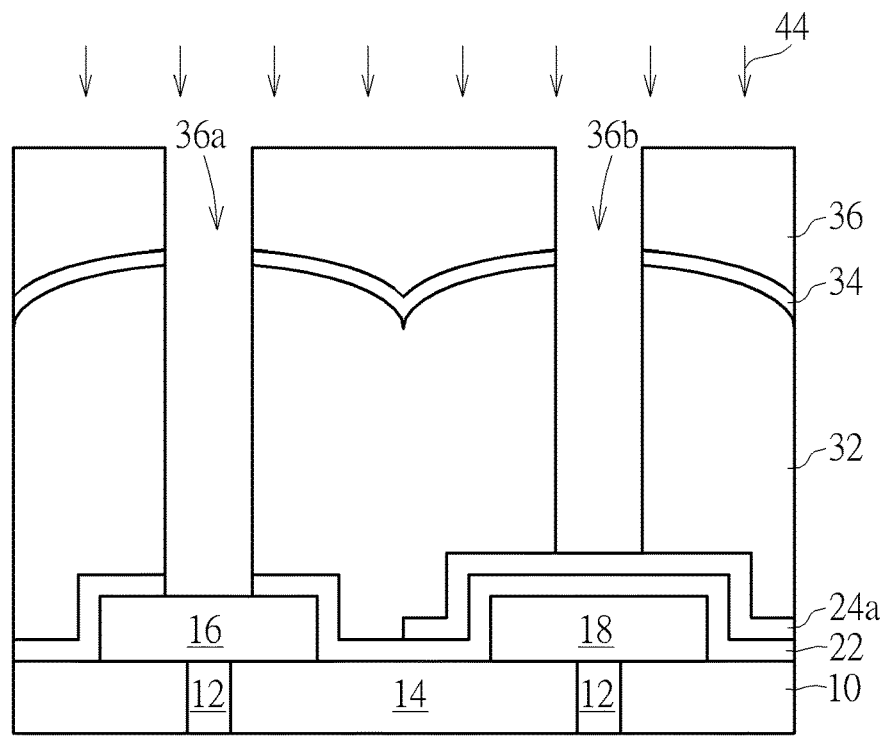
Figure 6:
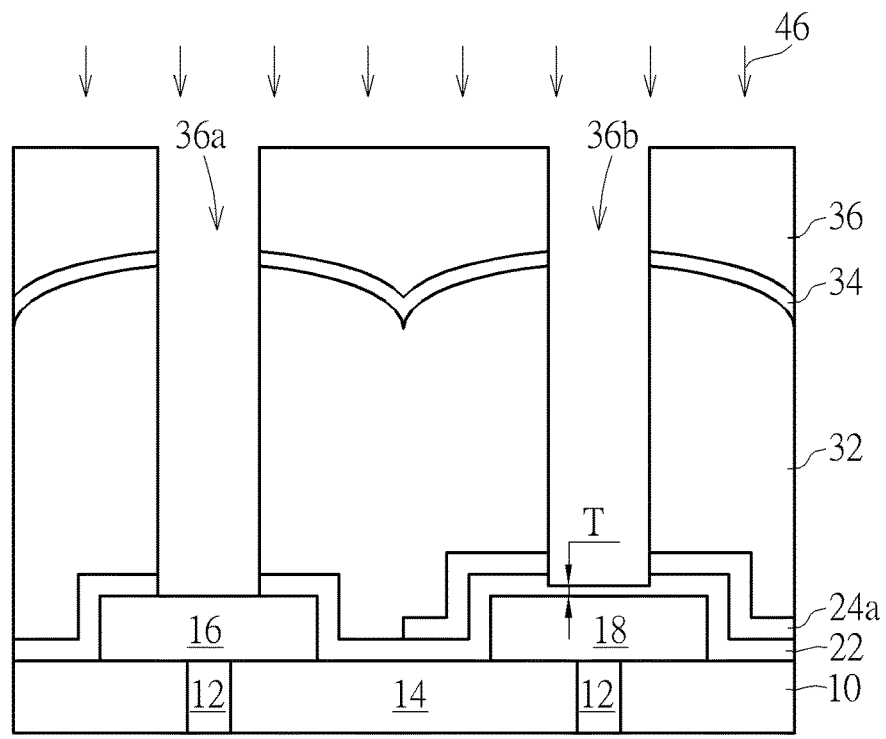

The following description as shown in FIG. 4 to FIG. 6 illustrates performing successive etching steps to remove the dielectric materials from the pad opening 36a and the fuse opening 36b, thereby extending the pad opening 36a and the fuse opening 36b downwardly to respective pre-determined depths.

Please refer to FIG. 4. After the pad opening 36a and the fuse opening 36b are defined in the passivation layer 36, a first etching step 42 is performed to remove the dielectric layer 34 from the pad opening 36a and the fuse opening 36b and further remove an amount of the underlying dielectric layer 32. The first etching step 42 may be a dry etching step using fluoride-based etchants, such as $CF_4$, $CHF_3$, $C_4F_6$, $C_4F_8$ or other organic flouro-compounds. By adjusting the ratios of the fluoride-based etchants, the first etching step 42 may have a low etching selectivity between the dielectric layer 34 and the dielectric layer 32. Preferably, the ratio of the removal rates of the dielectric layer 34 and the dielectric layer 32 during the first etching step 42 is approximately 1:1. Due to the low etching selectivity of the first etching step 42, the surface topography of the dielectric layer 34 exposed in the pad opening 36a and the fuse opening 36b may be replicated to the exposed surface of the dielectric layer 32 after the first etching step 42. As shown in FIG. 4, the dielectric layer 32 exposed in the pad opening 36a and the fuse opening 36b may have convex surface topography.

Please refer to FIG. 5. Subsequently, a second etching step 44 is performed. By using the pad metal 16 and the etching stop layer 24a as an etching stopping layer, the second etching step 44 etches away the dielectric layer 32 from the pad opening 36a and the fuse opening 36b downwardly until the pad metal 16 and the etching stop layer 24a are exposed. The second etching step 44 may also be a dry etching step using fluoride-based etchants, such as $CF_4$, $CHF_3$, $C_4F_6$, $C_4F_8$ or other organic flouro-compounds. By adjusting the ratios of the fluoride-based etchants, the second etching step 44 may have a high etching selectivity between the dielectric layer 32 and the etching stop layer 24a. Preferably, the ratio of the removal rates of the dielectric layer 32 and the etching stop layer 24a during the second etching step 44 is between 3.5:1 and 5.5:1. According to the embodiment, the liner 22 may comprise similar material with the dielectric layer 32, such as silicon oxide, and the liner 22 vertically above the top surface of the pad metal 16 is also removed by the second etching step 44, exposing the pad metal 16.

Please refer to FIG. 6. Subsequently, a third etching step 46 is performed to remove the exposed etching stop layer 24a from the fuse opening 36b and further removes an amount of the underlying liner 22 until a target thickness T of the remaining liner 22 is achieved. After the third etching step 46, an upper surface of the liner 22 is exposed from the fuse opening 36b without exposing any portion of the fuse metal 18. The third etching step 46 may also be a dry etching step using fluoride-based etchants, such as $CF_4$, $CHF_3$, $C_4F_6$, $C_4F_8$ or other organic flouro-compounds. The third etching step 46 may have a low etching selectivity between the etching stop layer 24a and the liner 22. Preferably, the ratio of the removal rates of the etching stop layer 24a and the liner 22 during the third etching step 46 is approximately 1:1.

It is one feature of the present invention that by forming a liner and an etching stop layer selectively covering the top surface of the fuse metal, a pad opening and a fuse opening may be formed concurrently through the same process steps. A thin dielectric layer (the remaining liner 22) may be formed with uniform and well-controlled thickness covering the top surface of the fuse metal, preventing the fuse metal from being exposed to the environment. The risk of corrosion or oxidation of the fuse metal may be therefore avoided and a stable fusing process and better yield may be achieved.

Figure 7:
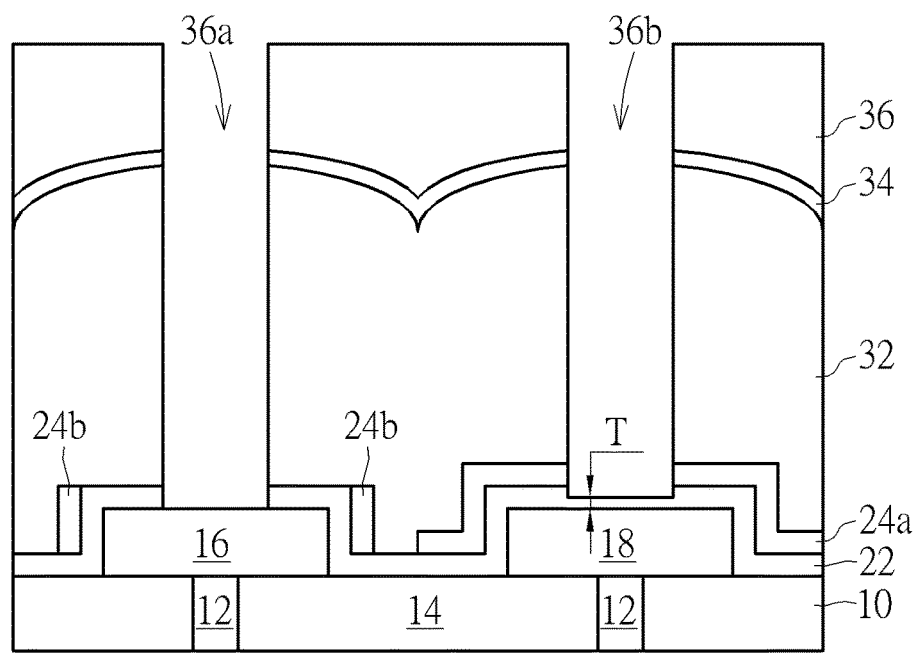
FIG. 7 shows a modification of the first embodiment.

Please refer to FIG. 7, which is a modification of the first embodiment. In the step of selectively removing the etching stop material layer 24, the etching stop material layer 24 is etched more anisotropically and consequently a portion of the etching stop material layer 24 may remain on the sidewall of the pad metal 16 and form a spacer 24b. It is known that process variation may cause pad opening 36a miss-aligned with the pad metal 16 and a seam may formed between the pad metal 16 and sidewall of the pad opening 36a. Corrosive chemicals may easily remain in the seam and corrode the metal. By forming the spacer 24b on the sidewall of the pad metal 16, the risk of metal corrosion is eliminated. The spacer 24b may have a top surface flush with the liner 22, as shown in FIG. 7. In various embodiments, the spacer 24b may be formed to have a taper or curved surface.

Figure 8:
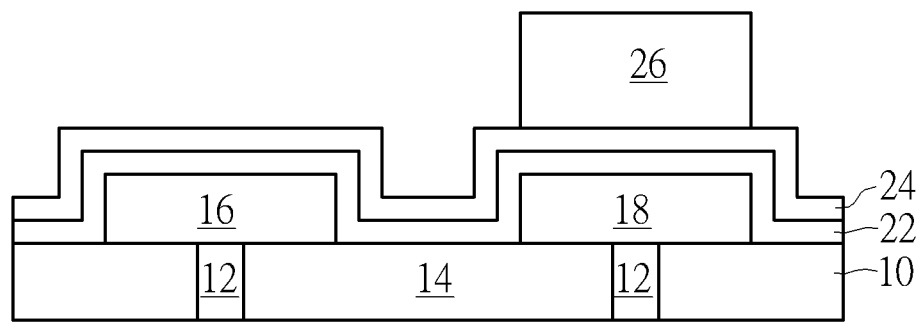
FIG. 8 to FIG. 10 are cross-sectional diagrams illustrating the process steps of forming a semiconductor structure according to a second embodiment of the present invention.
Figure 9:
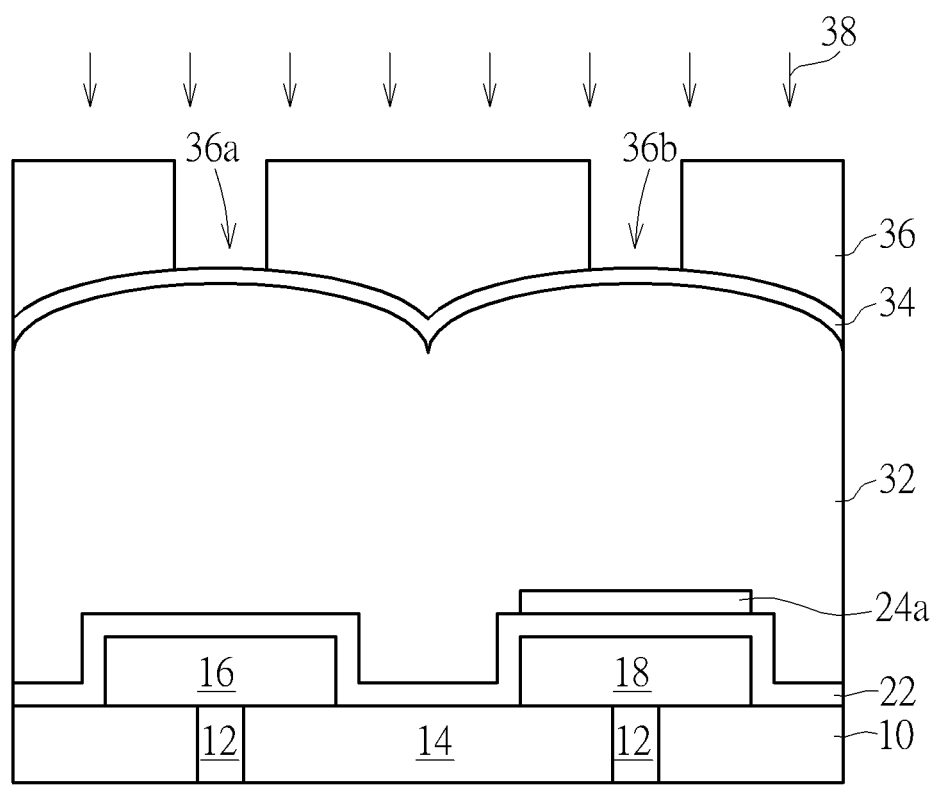
Figure 10:
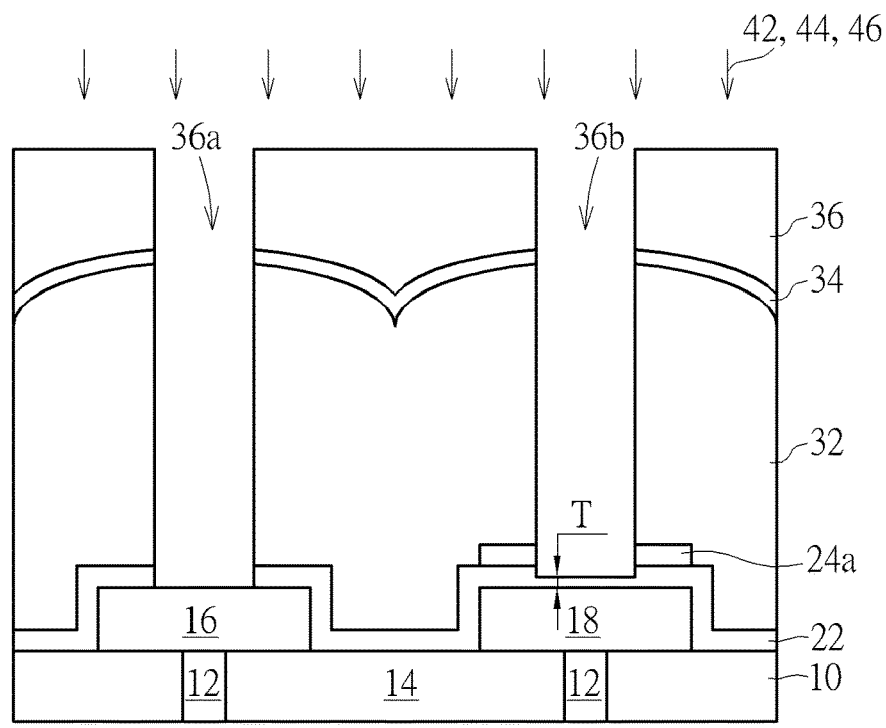

FIG. 8 to FIG. 10 are cross-sectional diagrams illustrating the steps of forming the semiconductor structure according to a second embodiment of the present invention. For the sake of simplicity, like reference numerals are used to refer to the same material layers or process steps as described in the first embodiment. The difference between the first embodiment and the second embodiment is that, in the second embodiment, the patterned photoresist layer 26 only covers the top surface of the fuse metal 18, thereby the etching stop layer 24a is formed only disposed atop the fuse metal 18.

Please refer to FIG. 8. Similarly, a substrate 10 comprising vias 12 and interlayer dielectric layer 14 is provided. A pad metal 16 and a fuse metal 18 are formed on the substrate 10. A liner 22 and an etching stop material layer 24 are formed successively and conformally covering the substrate 10, the top surfaces and sidewalls of the pad metal 16 and the fuse metal 18. A patterned photoresist layer 26 is then formed on the etching stop material layer 24 and only covering the top surface of the fuse metal 18. Preferably, the width of the patterned photoresist layer 26 is equal or slightly larger than the width of the fuse metal 18. The top surface of the fuse metal 18 is completely overlapped by the patterned photoresist layer 26. Subsequently, the portion of the etching stop material layer 24 not covered by the patterned photoresist layer 26 is removed, forming an etching stop layer 24a only disposed atop the top surface of the fuse metal 18. After that, a dielectric layer 32, a dielectric layer 34 and a passivation layer 36 are successively formed. The passivation layer 36 is then patterned to define a pad opening 36a and a fuse opening 36b, as shown in FIG. 9.

After that, similarly, a first etching step 42, a second etching step 44 and a third etching step 46 are performed successively, using the patterned passivation layer 36 as an etching mask to remove dielectric materials from the pad opening 36a and the fuse opening 36b downwardly until the pad metal 16 and the liner 22 on the fuse metal 18 are exposed, as shown in FIG. 10.

Figure 11:
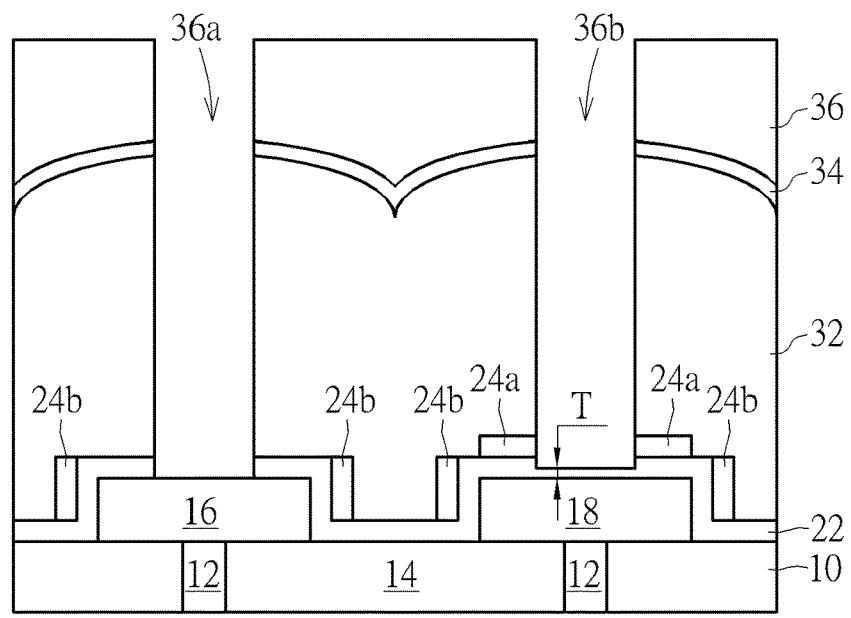
FIG. 11 shows a modification of the second embodiment.

FIG. 11 is a modification of the second embodiment. As shown in FIG. 11, portions of the etching stop material layer 24 on the sidewall of the pad metal 16 and the sidewall of the fuse metal 18 may not be removed and become spacers 24b.

FIG. 12 to FIG. 15 are cross-sectional diagrams illustrating the steps of forming the semiconductor structure according to a third embodiment of the present invention. For the sake of simplicity, like reference numerals are used to refer to the same material layers or process steps as described in the previous embodiments. The difference between the first embodiment and the third embodiment is that, in the third embodiment, a patterned photoresist layer 26 only exposes the portion of the etching stop material layer 24 directly above the top surface of the pad metal 16. The etching stop layer 24a comprising an opening 24c vertically aligned above the pad metal 16 is therefore obtained, exposing the liner 22 atop the top surface of the pad metal 16.

Figure 12:
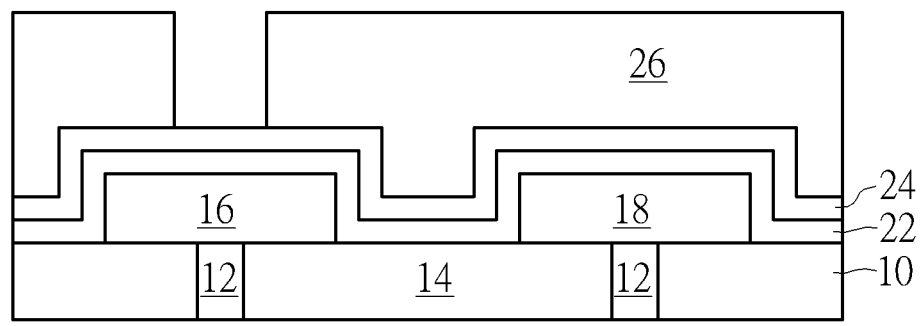
FIG. 12 to FIG. 15 are cross-sectional diagrams illustrating the process steps of forming a semiconductor structure according to a third embodiment of the present invention.
Figure 13:
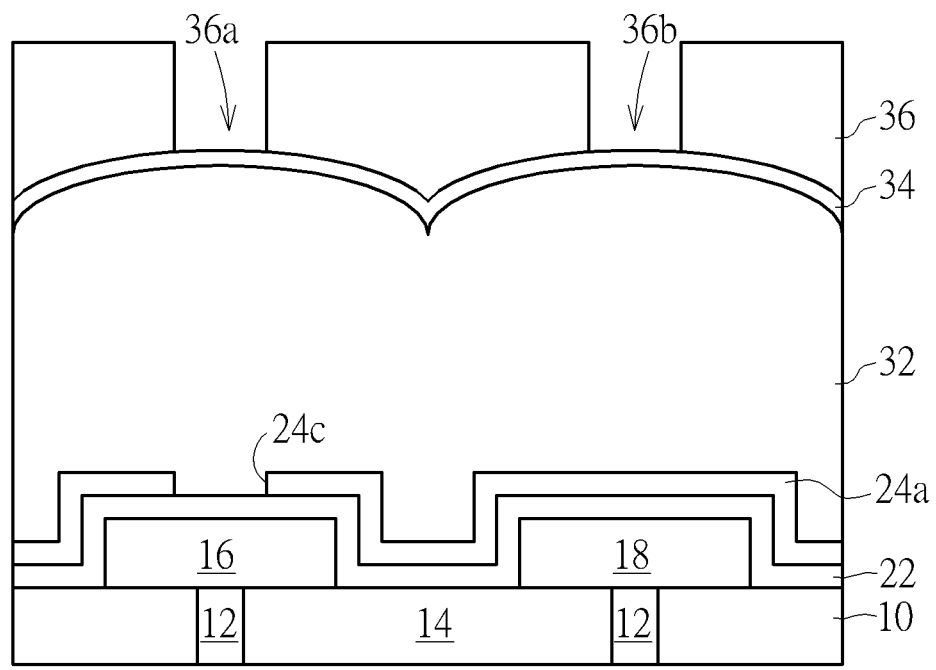

Please refer to FIG. 12. Similarly, a substrate 10 comprising vias 12 and an interlayer dielectric layer 14 is provided. A pad metal 16 and a fuse metal 18 are formed on the substrate 10. A liner 22 and an etching stop material layer 24 are formed successively and conformally covering the substrate 10, the top surfaces and sidewalls of the pad metal 16 and the fuse metal 18. A patterned photoresist layer 26 is then formed on the etching stop material layer 24. Only a portion of the etching stop material layer 24 directly on the top surface of the pad metal 16 is exposed from the patterned photoresist layer. Subsequently, the portion of the etching stop material layer 24 exposed from the patterned photoresist layer 26 is removed, forming an etching stop layer 24a comprising an opening 24c vertically above the fuse metal 18. After that, a dielectric layer 32, a dielectric layer 34 and a passivation layer 36 are successively formed. The passivation layer 36 is then patterned to define a pad opening 36a and a fuse opening 36b, as shown in FIG. 13. Preferably, the pad opening 36a is aligned with the opening 24c.

Figure 14:
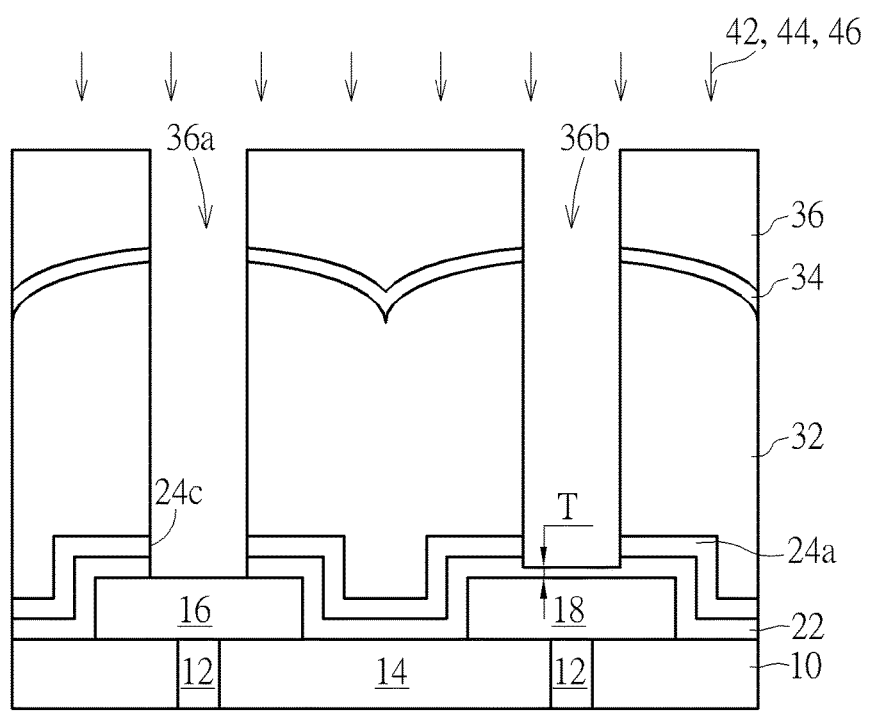

Similarly, a first etching step 42, a second etching step 44 and a third etching step 46 are then performed, using the patterned passivation layer 36 as an etching mask to etch the dielectric materials from the pad opening 36a and the fuse opening 36b downwardly until the pad metal 16 and the liner 22 on the top surface of the fuse metal 18 are exposed. As shown in FIG. 14, preferably, the pad opening 36a and the opening 24c are aligned and have the same width, and the liner 22 and the dielectric layer 32 would not be in direct contact with each other by the etching stop layer 24a disposed therebetween. According to the third embodiment, distal ends of the etching stop layer 24a and the liner 22 may be exposed from the sidewall of the pad opening 36a.

Figure 15:
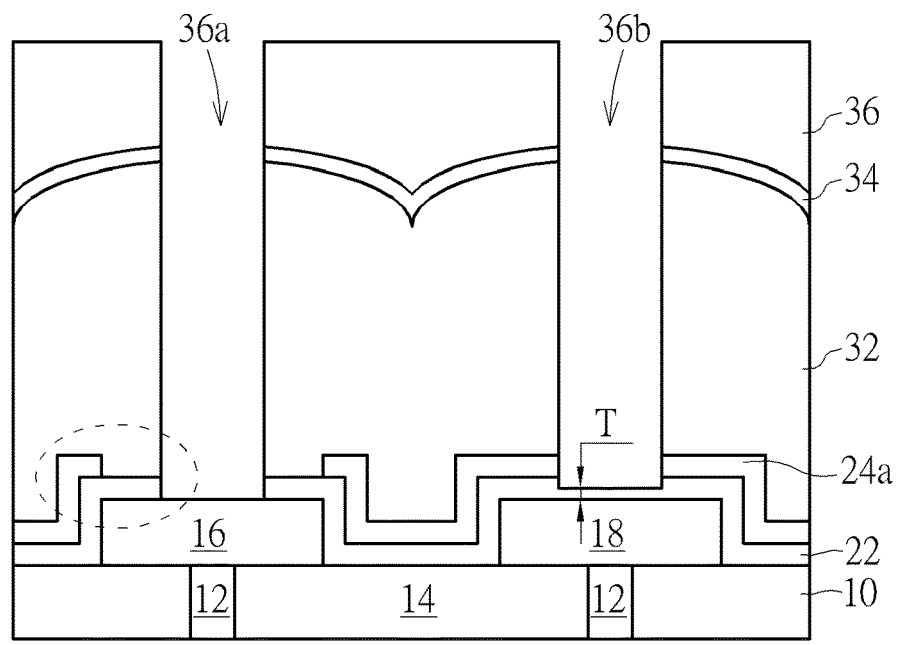
Figure 15:
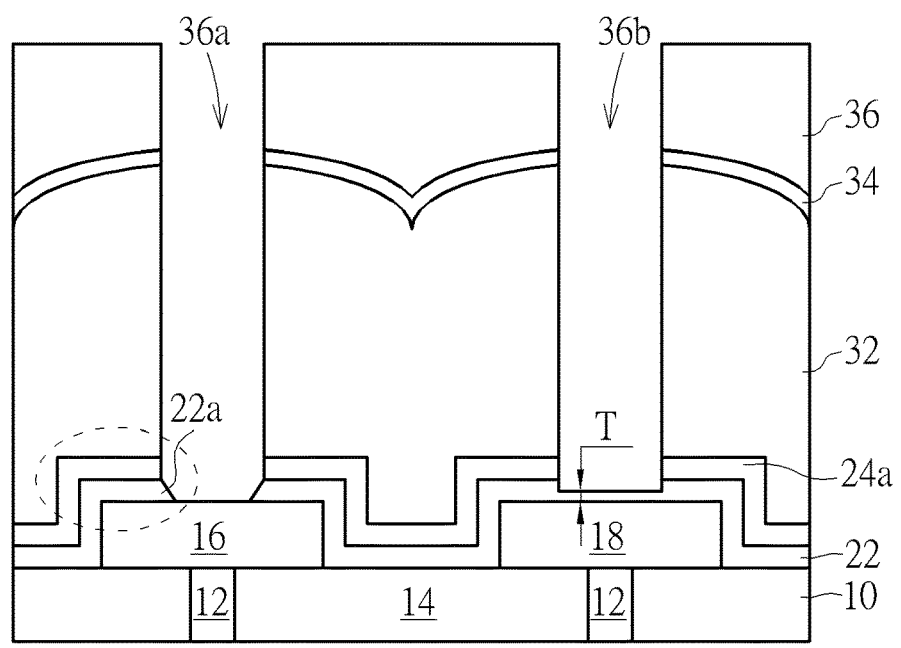

FIG. 15 shows variations of the third embodiment when the pad opening 26a and the opening 24c have different widths. Please refer to the upper FIG. 15(a). When the opening 24c has a width larger than that of the pad opening 36a, only liner 22 would be exposed from the sidewall of the pad opening 36a. The etching stop layer 24a is embedded in the dielectric layer 32 and not exposed from the pad opening 36a. Please refer to the lower FIG. 15(b). On the other hand, when the pad opening 36a defined in the passivation layer 36 has a width larger than that of the opening 24c, after the first etching step 42 and the second etching step 44 have been finished and before the third etching step 46 is performed, the distal ends of etching stop layer 24a adjacent to the opening 24c and the underneath liner 22 masked by the etching stop layer 24a are exposed and protruding from the sidewall of the pad opening 36a. During the third etching step 46 with low selectivity, the protruding distal end of the etching stop layer 24a is etched and an amount of the underneath liner 22 is etched too, resulting in a foot portion 22a of the liner 22. As shown in FIG. 15 (b), the pad opening 36a may have a rounded bottom corner which is able to prevent corrosive chemicals remained in the corner of the pad opening 36a. Furthermore, the rounded bottom of the pad opening 36a may facilitate the formation and adhesion of wire bond or solder bump in the pad opening 36a.

FIG. 16 to FIG. 20 are cross-sectional diagrams illustrating the steps of forming the semiconductor structure according to a fourth embodiment of the present invention. For the sake of simplicity, like reference numerals are used to refer to the same material layers or process steps as described in the previous embodiments. In the fourth embodiment, the pad metal 54 and the fuse metal 18 are formed in different metal layers and have different horizontal levels. For example, the pad metal 54 may be formed in the upper-most metal layer (top metal layer) of the semiconductor structure, and the fuse metal 18 may be formed in an intermediate metal layer.

Figure 16:
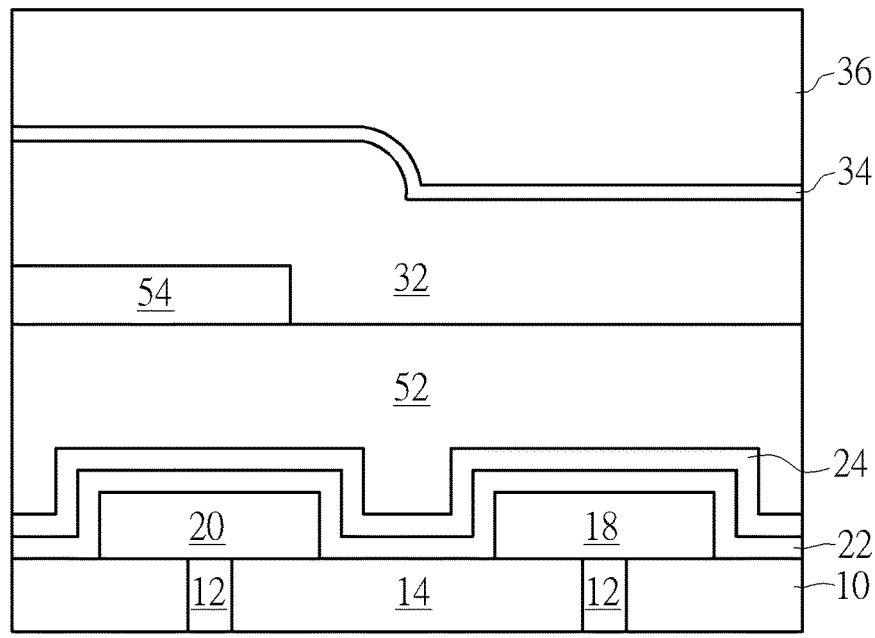
FIG. 16 to FIG. 20 are cross-sectional diagrams illustrating the process steps of forming a semiconductor structure according to a fourth embodiment of the present invention.

Please refer to FIG. 16. A substrate 10 is provided. A wiring metal 20 and a fuse metal 18 are formed on the substrate 10. The substrate 10 may comprise an interlayer dielectric layer 14 and vias 12 respectively connected to the wiring metal 20 and the fuse metal 18. The method of forming the wiring metal 20 and the fuse metal 18 may include blanketly depositing a metal layer on the substrate 10, and then patterning the metal layer into the wiring metal 20 and the fuse metal 18. Similarly, the via 12 may be formed structurally integrated with the wiring metal 20 or fuse metal 18 by filling the opening of each via 12 with the metal layer when depositing the metal layer. Subsequently, a liner 22 and an etching stop material layer 24 are formed successively and conformally covering the substrate 10, the top surfaces and sidewalls of the wiring metal 20 and the fuse metal 18. An interlayer dielectric layer 52 is then formed on the etching stop material layer 24. The interlayer dielectric layer 52 may be planarized and have a planar top surface. A pad metal 54 is then formed on the interlayer dielectric layer 52. After that, a dielectric layer 32, a dielectric layer 34 and a passivation layer 36 are successively formed completely covering the pad metal 54 and the interlayer dielectric layer 52. The interlayer dielectric layer 52 may be made of the same material with the dielectric layer 32, for example, silicon oxide. The interlayer dielectric layer 52 may be single layered or multi-layered. According to various embodiments, the interlayer dielectric layer 52 may have other semiconductor structures (not shown) formed therein including capacitors, metal wirings and vias, but not limited thereto. Notably, the interlayer dielectric layer 52 may not have any semiconductor structures formed vertically above the fuse metal.

Figure 17:
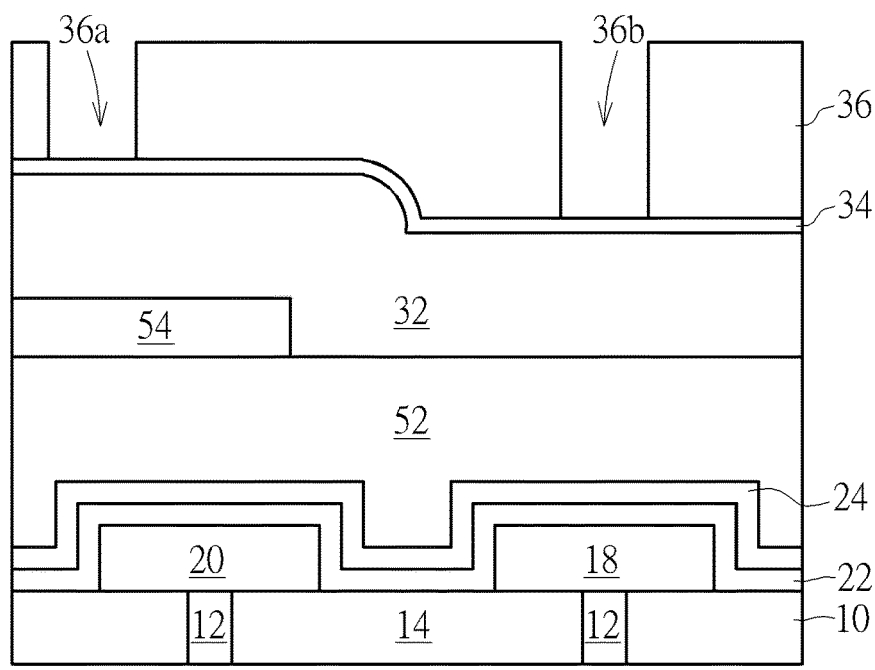

Please refer to FIG. 17. The passivation layer 36 is then patterned to define the pad opening 36a and the fuse opening 36b. The pad opening 36a is vertically aligned above the pad metal 54, and the fuse opening 36b is vertically aligned above the fuse metal 18. The dielectric layer 34 is exposed from the pad opening 36a and the fuse opening 36b respectively.

Figure 18:
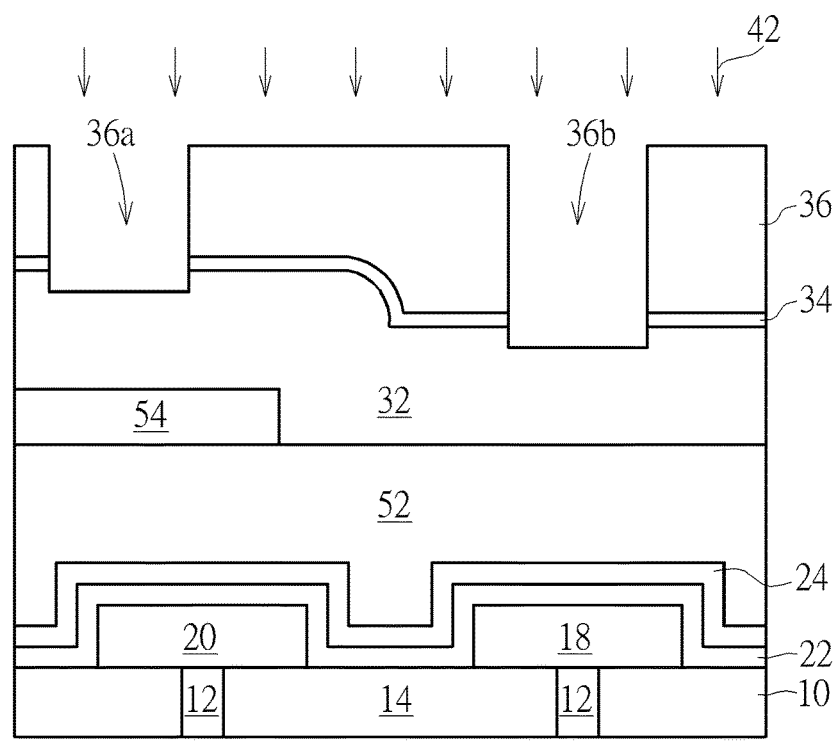

Please refer to FIG. 18. Subsequently, a first etching step 42 is performed, using the patterned passivation layer 36 as an etching mask to remove the dielectric layer 34 and an amount of the underneath dielectric layer 32 from the pad opening 36a and the fuse opening 36b. Preferably, the ratio of the removal rates of the dielectric layer 34 and the dielectric layer 32 in the first etching step 42 is approximately 1:1. In the fourth embodiment, the flat top surfaces of the dielectric layer 34 may be transferred to the exposed surface of the dielectric layer 32 after the first etching step 42.

Figure 19:
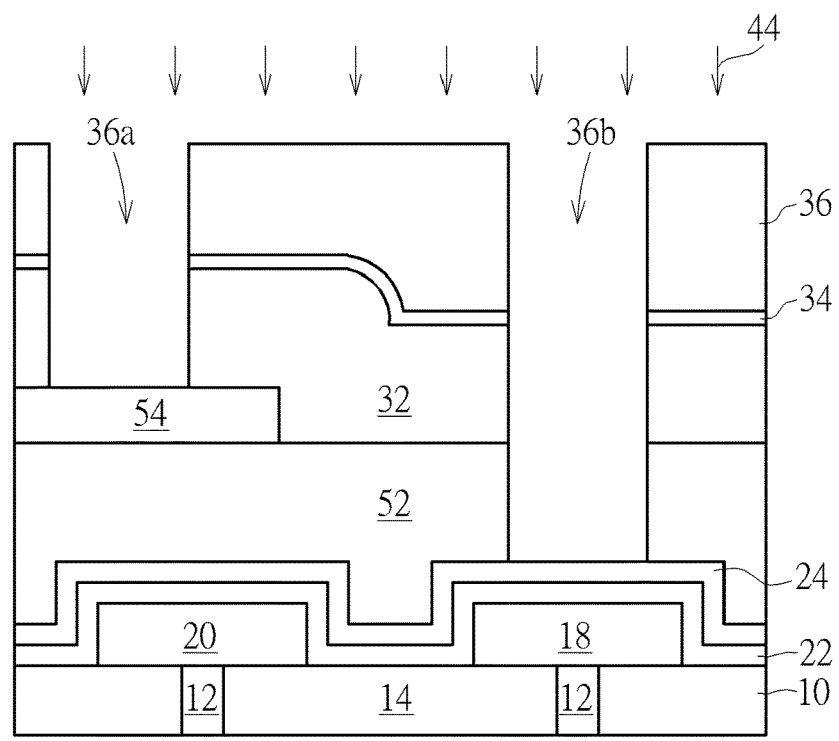

Please refer to FIG. 19. Subsequently, a second etching step 44 is performed, using the patterned passivation layer 36 as an etching mask to etch the dielectric layer 32 and dielectric layer 52 downwardly until the pad metal 54 and the etching stop material layer 24 over the top surface of the fuse metal 18 are exposed. Preferably, the ratio of the removal rates of the dielectric layers 32, 52 and the etching stop material layer 24 is between 3.5:1 and 5.5:1.

Figure 20:
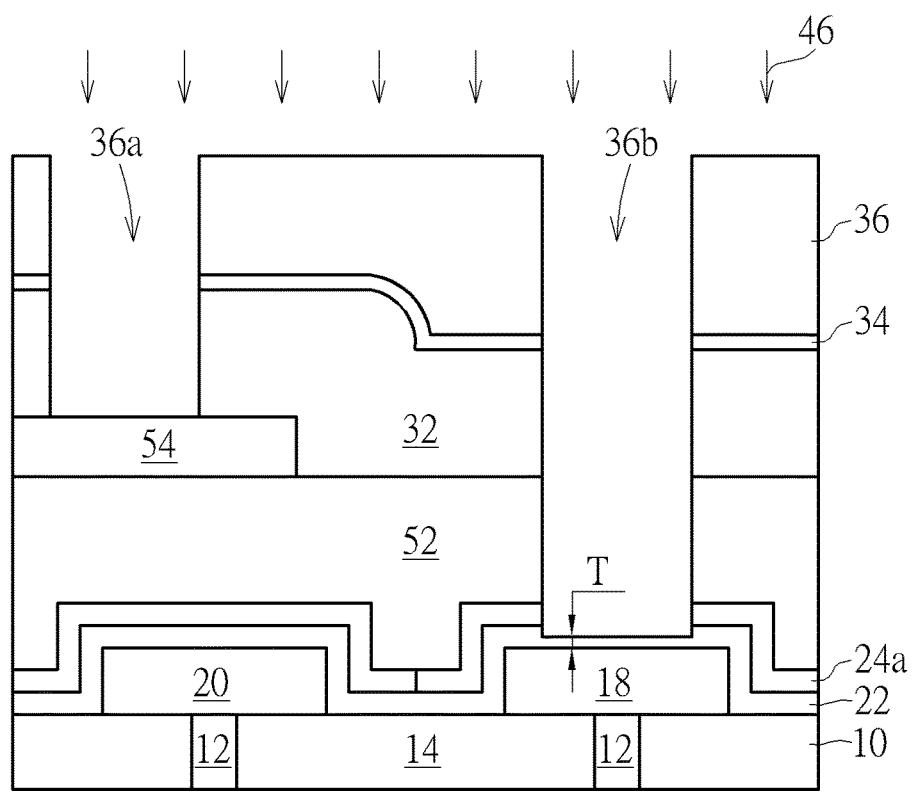

Please refer to FIG. 20. Following, a third etching step 46 is performed to remove the exposed etching stop material layer 24 and further removes a portion of the underlying liner 22, until a target thickness T of the remaining liner 22 is achieved. None of the fuse metal 18 would be exposed from the liner 22 after the third etching step 46. Similarly, the ratio of the removal rates of the etching stop material layer 24 and the liner 22 is preferably around 1:1.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor structure, comprising:
   a substrate comprising a pad metal and a fuse metal formed thereon, wherein the pad metal and the fuse metal are formed in a same material layer and have a same thickness;
   a liner on the pad metal and the fuse metal;
   an etching stop layer on the liner on the fuse metal;

a dielectric layer on the liner and on the etching stop layer, wherein the dielectric layer is in direct contact with the liner on a top surface the pad metal;

a passivation layer on the dielectric layer;

a pad opening vertically aligned above the pad metal, penetrating through the passivation layer, the dielectric layer and the liner, exposing the pad metal; and a fuse opening aligned vertically above the fuse metal, penetrating through the passivation layer, the dielectric layer and the etching stop layer without penetrating through the liner and exposing a surface of the liner.

2. The semiconductor structure according to claim 1, wherein the liner and the dielectric layer comprise silicon oxide, and the etching stop layer comprises silicon nitride.

3. The semiconductor structure according to claim 1, wherein the passivation layer comprises polyimide.

4. The semiconductor structure according to claim 1, wherein the liner conformally covers the substrate, the top surface and a sidewall of the fuse metal and a sidewall of the pad metal.

5. The semiconductor structure according to claim 1, wherein the etching stop layer is sandwiched between the liner and the dielectric layer on the top surface of the fuse metal and completely separates the liner from the dielectric layer on the top surface of the fuse metal.

6. The semiconductor structure according to claim 1, wherein the etching stop layer covers a top surface and a sidewall of the fuse metal, and the dielectric layer is-not in direct contact with the liner on the top surface and the sidewall of the fuse metal.

\* \* \* \* \*